United States Patent
Ku et al.

(10) Patent No.: US 7,736,968 B2
(45) Date of Patent: Jun. 15, 2010

(54) REDUCING POLY-DEPLETION THROUGH CO-IMPLANTING CARBON AND NITROGEN

(75) Inventors: Keh-Chiang Ku, Sindan (TW);
Cheng-Lung Hung, Hsin-Chu (TW);
Li-Ting Wang, Tainan (TW);
Chien-Hao Chen, Chuangwei Township (TW); Chien-Hao Huang, Banciao (TW); Wenli Lin, Hsin-Chu (TW);
Yu-Chang Lin, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/259,028

(22) Filed: Oct. 27, 2008

(65) Prior Publication Data

US 2010/0105185 A1 Apr. 29, 2010

(51) Int. Cl.
*H01L 21/8238* (2006.01)
(52) U.S. Cl. .................. 438/231; 438/232; 438/305; 438/585; 438/587; 438/592

(58) Field of Classification Search .................. None
See application file for complete search history.

(56) References Cited

U.S. PATENT DOCUMENTS

| 4,891,332 | A  | * | 1/1990 | Bloem et al. ............... 438/384 |
| 4,914,046 | A  | * | 4/1990 | Tobin et al. ............... 438/592 |
| 5,885,861 | A  | * | 3/1999 | Gardner et al. ............ 438/231 |
| 6,017,808 | A  | * | 1/2000 | Wang et al. ............... 438/528 |
| 6,373,113 | B1 | * | 4/2002 | Gardner et al. ............ 257/411 |
| 7,498,642 | B2 | * | 3/2009 | Chen et al. ............... 257/408 |
| 2006/0084217 | A1 | * | 4/2006 | Luo et al. ............... 438/199 |

* cited by examiner

*Primary Examiner*—Zandra Smith
*Assistant Examiner*—Khanh B Duong
(74) *Attorney, Agent, or Firm*—Slater & Matsil, L.L.P.

(57) ABSTRACT

A method for forming a semiconductor structure includes providing a semiconductor substrate; forming a gate dielectric layer over the semiconductor substrate; forming a gate electrode layer over the gate dielectric layer; doping carbon and nitrogen into the gate electrode layer; and, after the step of doping carbon and nitrogen, patterning the gate dielectric layer and the gate electrode layer to form a gate dielectric and a gate electrode, respectively.

17 Claims, 6 Drawing Sheets

REDUCING POLY-DEPLETION THROUGH CO-IMPLANTING CARBON AND NITROGEN

TECHNICAL FIELD

This invention relates generally to semiconductor devices, and more particularly to the structure and fabrication methods of metal-oxide-semiconductor devices.

BACKGROUND

Polysilicon is widely used to form gate electrodes of metal-oxide-semiconductor (MOS) devices. Polysilicon has a high resistivity, and hence needs to be doped, so that its resistivity may satisfy the requirement of the MOS devices. The doped impurity is activated through anneals.

MOS devices with polysilicon gate electrodes exhibit a carrier depletion effect, which is also referred to as a poly depletion effect. The poly depletion effect occurs when applied electrical fields sweep away carriers from regions close to gate dielectrics, forming depletion layers. In an n-doped polysilicon layer, the depletion layer includes ionized non-mobile donor sites, whereas in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

In order to reduce the poly depletion effect, either the impurity dosage or the temperature of annealing, which is used to activate the impurity, needs to be increased. However, these approaches may adversely result in the dopants to be diffused into gate dielectrics, causing the degradation of the reliability of gate dielectrics and the increase in the gate leakage currents. Further, the dopants may penetrate through the gate dielectrics and diffuse into the underlying substrates, causing the threshold voltages of the resulting MOS devices to be increased.

With the increasing down-scaling of integrated circuits, gate dielectrics also become thinner, making the situation worse. The leakage currents tend to increase with the reduction in the thicknesses of gate dielectrics. This makes the penetration of dopants through gate dielectrics even easier. New methods to reduce the diffusion effect are thus needed.

SUMMARY OF THE INVENTION

In accordance with one aspect of the present invention, a method for forming a semiconductor structure includes providing a semiconductor substrate; forming a gate dielectric layer over the semiconductor substrate; forming a gate electrode layer over the gate dielectric layer; doping carbon and nitrogen into the gate electrode layer; and, after the step of doping carbon and nitrogen, patterning the gate dielectric layer and the gate electrode layer to form a gate dielectric and a gate electrode, respectively.

In accordance with another aspect of the present invention, a method for forming a semiconductor structure includes providing a semiconductor substrate; forming a gate dielectric layer over the semiconductor substrate; forming a gate electrode layer over the gate dielectric layer; implanting carbon into the gate electrode layer; implanting nitrogen into the gate electrode layer; implanting an n-type impurity into the gate electrode layer; performing a first annealing to the gate electrode layer; patterning the gate dielectric layer and the gate electrode layer to form a gate stack; forming a source/drain region; and performing a second annealing to the source/drain region.

The advantageous features of the present invention include reduced diffusion of the impurities in gate electrodes, and hence gate dielectrics may be made thinner without causing the increase in the gate leakage currents.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for forming an n-type metal-oxide-semiconductor (MOS) device is provided. The intermediate stages of manufacturing embodiments of the present invention are illustrated. Throughout various views and illustrative embodiments of the present invention, like reference numbers are used to designate like elements.

Figure 1:
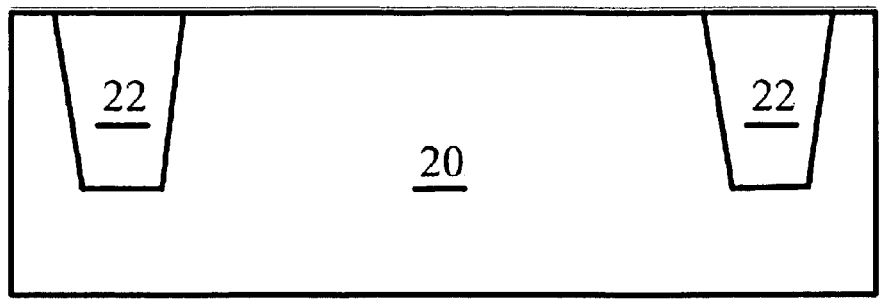
FIGS. 1 through 6 are cross-sectional views of intermediate stages in the manufacturing of an embodiment of the present invention, in which carbon and nitrogen are co-implanted into an NMOS device.

Referring to FIG. 1, substrate 20 is provided. Substrate 20 may be a bulk substrate comprising, for example, silicon, silicon germanium, or the like; although other commonly used structures and semiconductor materials such as silicon-on-insulator (SOI) and strained silicon layers may also be used. In an embodiment, substrate 20 is lightly doped with a p-type impurity. Shallow trench isolation (STI) regions 22 may be formed to define the boundary of the resulting MOS device.

Figure 2A:
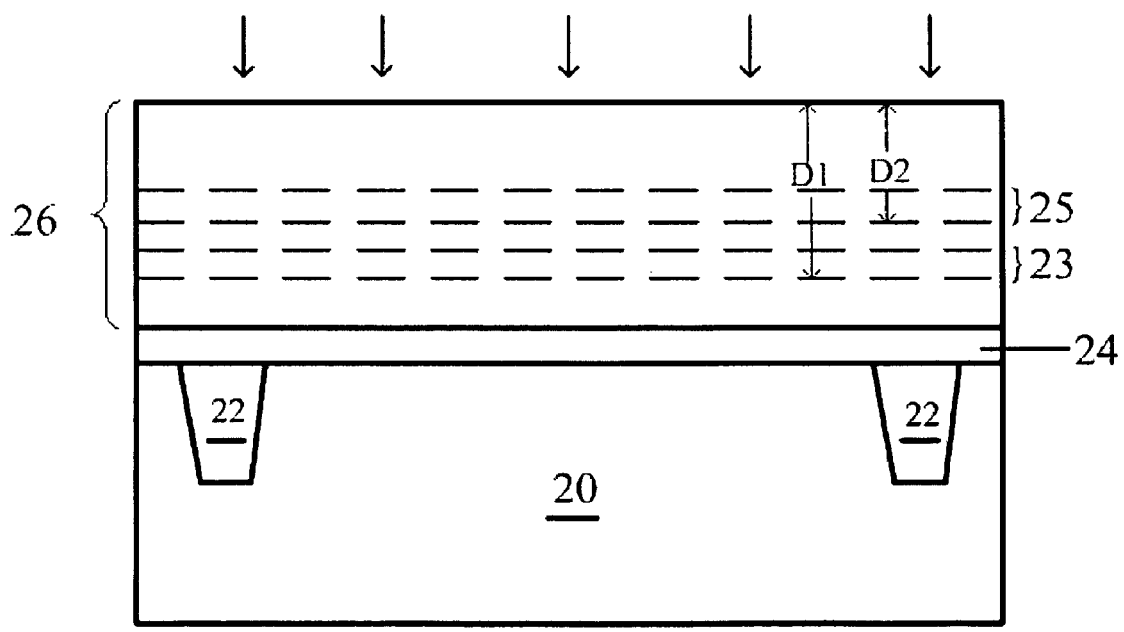

FIG. 2A illustrates the formation of gate dielectric layer 24 and gate electrode layer 26. In an embodiment, gate dielectric layer 24 includes silicon oxide, which may be formed by thermally oxidizing substrate 20. Alternatively, gate dielectric layer 24 is formed of a dielectric material having a high dielectric constant (k value), for example, greater than about 3.9. The applicable materials include nitrides such as silicon nitride, oxynitrides such as silicon oxynitride, metal oxides such as $HfO_x$, $HfZrO_x$, $HfSiO_x$, $HfTiO_x$, $HfAlO_x$ (wherein x is a positive number), and the like, and combinations thereof. Gate dielectric 24 may also have a multi-layer structure including more than one layer of the above-discussed materials. In an embodiment, the thickness of gate dielectric 24 is less than about 21 Å. One skilled in the art will realize, however, that the dimensions recited throughout the description are merely examples, and will change if different formation technologies are used.

Gate electrode layer 26, which is formed of polysilicon or amorphous silicon, is formed over gate dielectric layer 24. The formation methods of gate dielectric layer 24 and gate electrode layer 26 include atomic layer chemical vapor deposition (ALCVD or ALD), plasma enhanced chemical vapor deposition (PECVD), or other commonly used methods.

A pre-gate doping is preferably performed to increase the doping concentration in the gate of the resulting MOS device. Preferably, the pre-gate doping includes co-implanting carbon and nitrogen with an n-type impurity. In an exemplary embodiment, carbon is doped with an energy between about 8 keV and about 14 keV, and a dosage between about $1E15/cm^2$ and about $3E15/cm^2$. Nitrogen is doped with an energy between about 6 keV and about 10 keV, and a dosage between about $1E15/cm^2$ and about $1E16/cm^2$. The n-type impurity may include phosphorous, arsenic, and combinations thereof. In an exemplary embodiment, the n-type impurity is doped with an energy between about 3 keV and about 6 keV, with a dosage between about $1E15/cm^2$ and about $1E16/cm^2$. Preferably, carbon is implanted to a greater depth than nitrogen. In FIG. 2A, the depth of carbon is shown as D1, while the depth of nitrogen is shown as D2. The depth of the n-type impurity may be substantially the same as the depth D2 of nitrogen. Experiments have revealed that the effect of co-implanting both carbon and nitrogen is better than implanting carbon alone or nitrogen alone as regarding the effect of hampering the diffusion of the n-type impurity, and the effect of reducing gate oxide leakage.

Figure 2B:
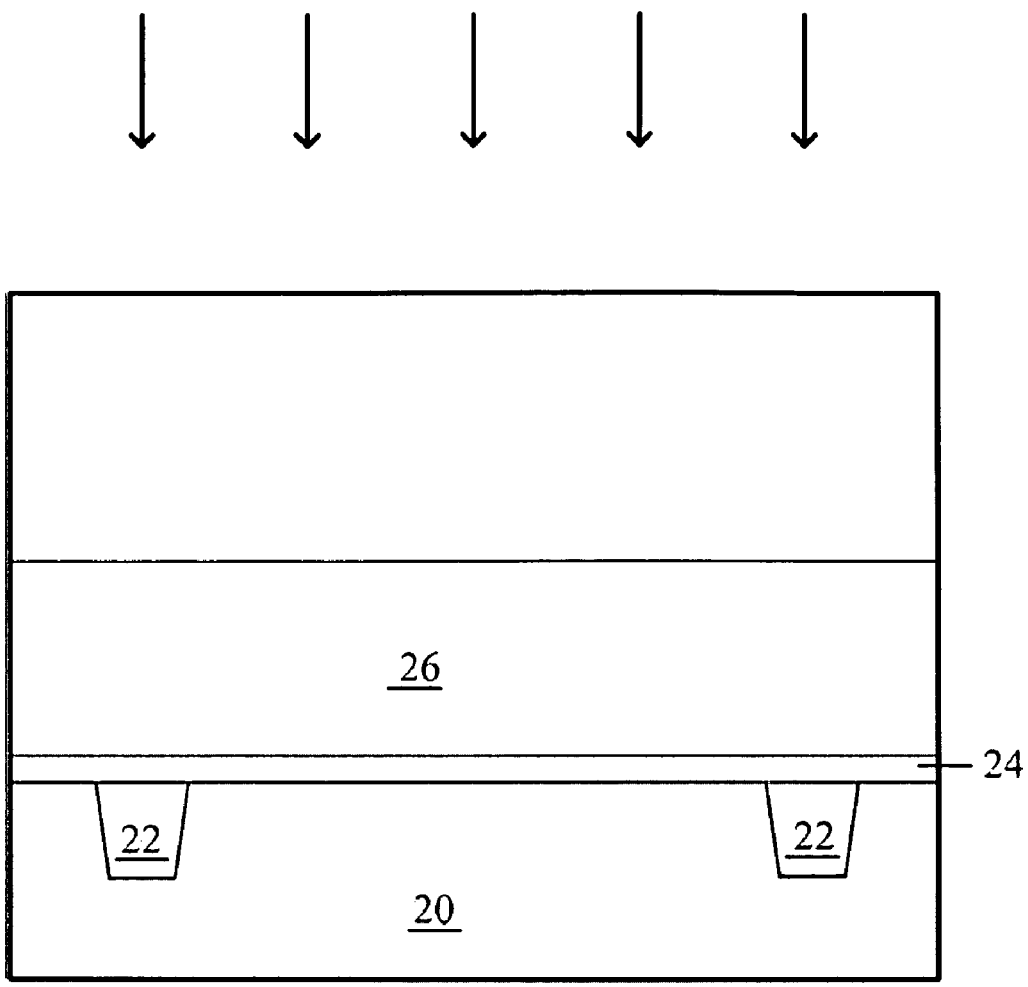

It is noted that the region illustrated in FIG. 2A is an NMOS region. At the time the NMOS region is implanted with nitrogen, carbon, and the n-type impurity, the PMOS regions on the same substrate 20 are preferably covered so that carbon, nitrogen, and the n-type impurity are not doped into the gate electrode of the PMOS devices. An exemplary PMOS region is shown in FIG. 2B, wherein the arrows symbolize the carbon, nitrogen, and the n-type impurity implantation.

In alternative embodiments, instead of implanting, the doping of carbon and nitrogen is in-situ performed simultaneously with the deposition of gate electrode layer 26. It is realized that carbon and nitrogen do not have to be doped throughout gate electrode 26. Instead, they may be doped only as sheet regions 23 and 25 (referring back to FIG. 2A), respectively. In this case, the top layer of gate electrode layer 26 is doped with the n-type impurity, but is free from carbon and nitrogen doping. In other embodiments, carbon and nitrogen may be doped throughout the regions with depths less than D1 and D2, respectively.

An annealing is then performed to activate the n-type impurity in gate electrode layer 26. In the preferred embodiment, laser annealing is used. Experiments have revealed that the laser annealing exhibits excellent result in the improvement of the activation rate of the n-type impurity. In alternative embodiments, other annealing methods, such as furnace annealing, spike annealing, flash annealing, and the like, can also be used. Carbon and nitrogen have two functions. First, the introduction of carbon and nitrogen advantageously reduces the diffusion of the n-type impurity in the subsequent annealing steps, and thus gate electrode layer 26 may be doped to a higher impurity concentration with less concern that the n-type impurity may diffuse into gate dielectric layer 24. Second, carbon and nitrogen may improve the solubility of the n-type impurity in gate electrode layer 26, so that the activation rate of the n-type impurity is improved.

Figure 3:
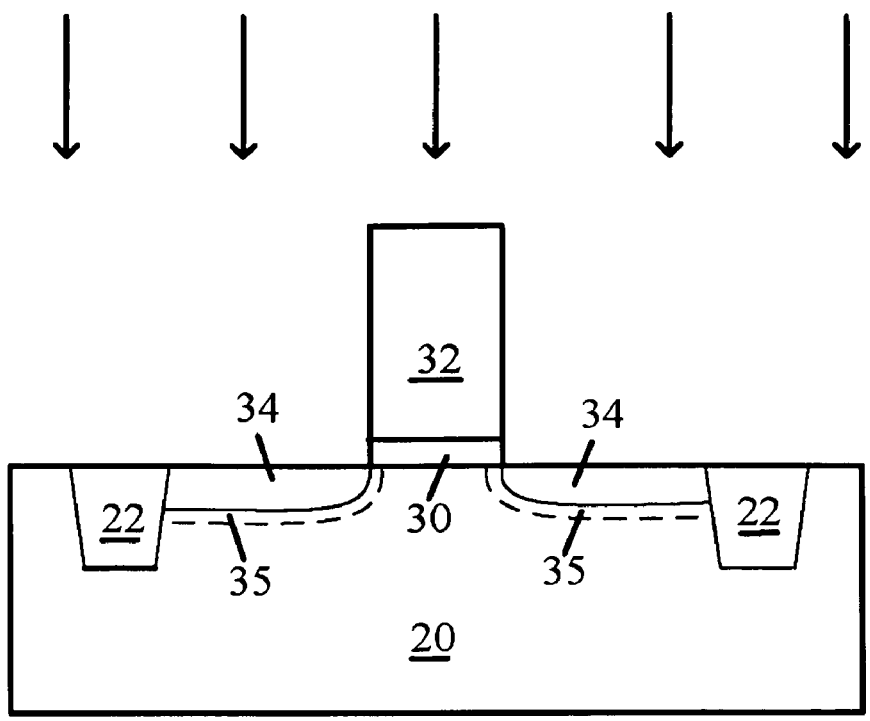

Gate electrode layer 26 and gate dielectric layer 24 are then patterned, as shown in FIG. 3. The remaining portions of gate dielectric layer 24 and gate electrode layer 26 form gate dielectric 30 and gate electrode 32, respectively.

Again referring to FIG. 3, LDD regions 34 are formed, preferably by implanting an n-type impurity such as phosphorus, arsenic, or the like. Carbon and nitrogen may also be co-implanted into LDD regions 34, forming co-implant regions 35. In an embodiment of the present invention, the implanted carbon and nitrogen overlap LDD regions 34. Alternatively, carbon and nitrogen may be implanted slightly deeper and slightly closer to the channel region than LDD regions 34. The co-implanting of carbon and nitrogen may be performed with a tilt angle, so that carbon and nitrogen atoms may extend directly under gate electrode 32. Further, pocket regions (not shown) may also be formed. The formation of pocket regions is known in the art, and hence is not discussed in detail herein.

Figure 4:
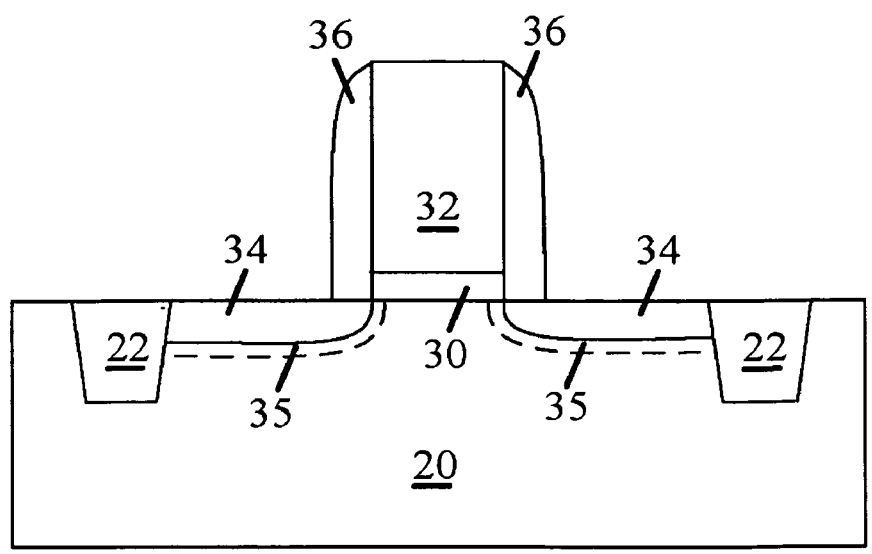

FIG. 4 illustrates the formation of gate spacers 36. As is known in the art, gate spacers 36 may be formed by blanket depositing one or more dielectric layer, and removing horizontal portions of the dielectric layer. The preferred methods for depositing the dielectric layer include plasma enhanced chemical vapor deposition (PECVD), low pressure chemical vapor deposition (LPCVD), sub-atmospheric chemical vapor deposition (SACVD), and the like. In an exemplary embodiment, each of gate spacers 36 includes a silicon nitride layer on an oxide liner.

Figure 5:
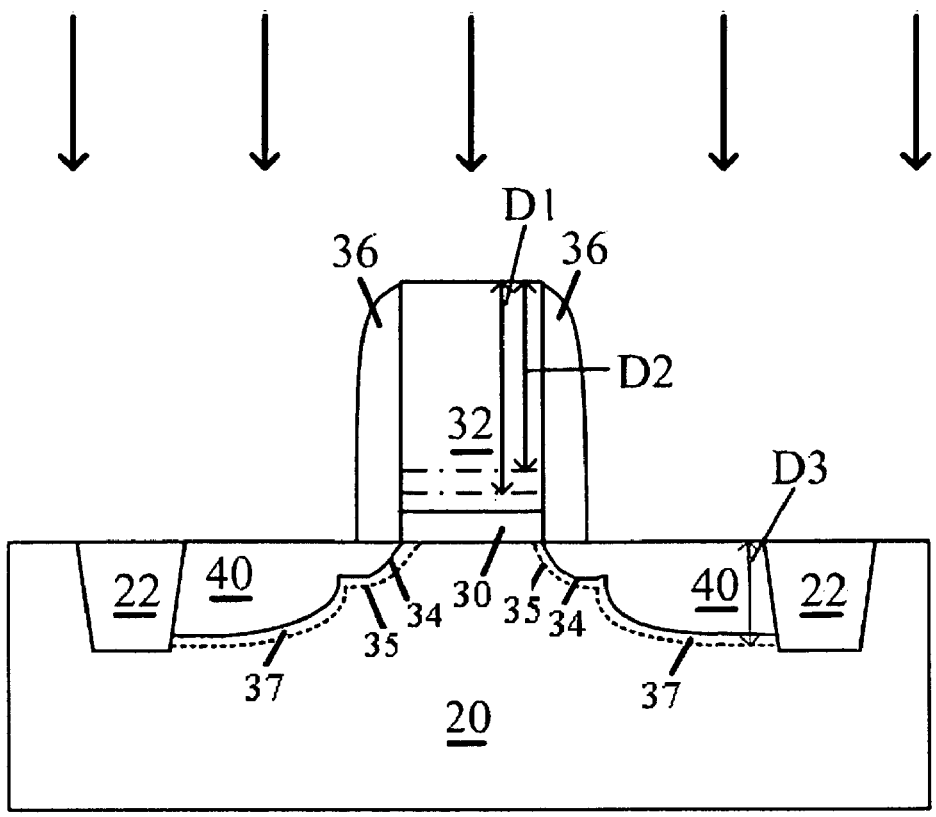

Next, as shown in FIG. 5, source/drain regions 40 are formed, preferably by implanting an n-type impurity. The n-type impurity preferably includes phosphorous, arsenic, or the like. In the preferred embodiment, carbon and nitrogen are co-implanted to overlap source/drain regions 40, forming co-implant regions 37. More preferably, carbon and nitrogen may extend slightly beyond the borders of source/drain regions 40. With the co-implant of carbon and nitrogen, the diffusion of the impurity in LDD regions 34 and source/drain regions 40 is reduced. As a result of the more concentrated impurity, the sheet resistances of LDD regions 34 and source/drain regions 40 are reduced, and greater junction abruptness is achieved. Again, the implanting of carbon and nitrogen may be performed with a tilt angle, so that carbon and nitrogen atoms may be slightly closer to the channel region than the respective source/drain regions 40. In an exemplary embodiment, the dosage of carbon is between about $1E14/cm^2$ and about $1E15/cm^2$, and the dosage of nitrogen is between about $1E14/cm^2$ and about $1E15/cm^2$. The n-type impurity is implanted with a dosage between about $1E14/cm^2$ and about $1E15/cm^2$.

In alternative embodiments, carbon and nitrogen may be co-implanted with either the formation of LDD regions 34 or the formation of source/drain regions 40, but not both. In yet other embodiments, no co-implantation of carbon and/or nitrogen is performed along with the formation of either one of LDD regions 34 and source/drain regions 40.

Preferably, the energy and dosage for implanting carbon and nitrogen into LDD regions 34 and/or source/drain regions 40 are lower than that for the pre-gate co-implant of carbon and nitrogen. In an exemplary embodiment, in the co-implant of source/drain regions 40, carbon is implanted using an energy between about 3 keV and about 8 keV, with a dosage between about $1E14/cm^2$ and about $1E15/cm^2$. Nitrogen is implanted using an energy between about 4 keV and about 10 keV, with a dosage between about $1E14/cm^2$ and about $5E15/cm^2$. Accordingly, the depth D3 of co-implant region 37 is less than depths D1 and D2.

The n-type impurities in LDD regions 34 and deep source/drain regions 40 are activated by an anneal. Preferably, the anneal includes a spike anneal and a millisecond anneal, which may include flash anneal, laser anneal, and the like. In alternative embodiments, other anneal methods, such as thermal anneal and rapid thermal annealing (RTA) may be used.

At the time LDD regions 34 and/or source/drain regions 40 are co-implanted with carbon, nitrogen, and the n-type impurities, the same elements are also implanted in gate electrode 32, which further increases the concentrations of carbon, nitrogen, and the n-type impurities in gate electrode 32. However, it is noted that the co-implant of carbon and nitrogen into LDD regions 34 and source/drain regions 40 cannot replace the pre-gate co-implant (of carbon and nitrogen) performed prior to the patterning of gate electrode layer 26. The reason is that the pre-gate co-implant needs to be performed at high energies and/or doses in order to achieve optimum results, and the energies and/or doses are too high for the formation of LDD regions 34 and source/drain regions 42.

Figure 6:
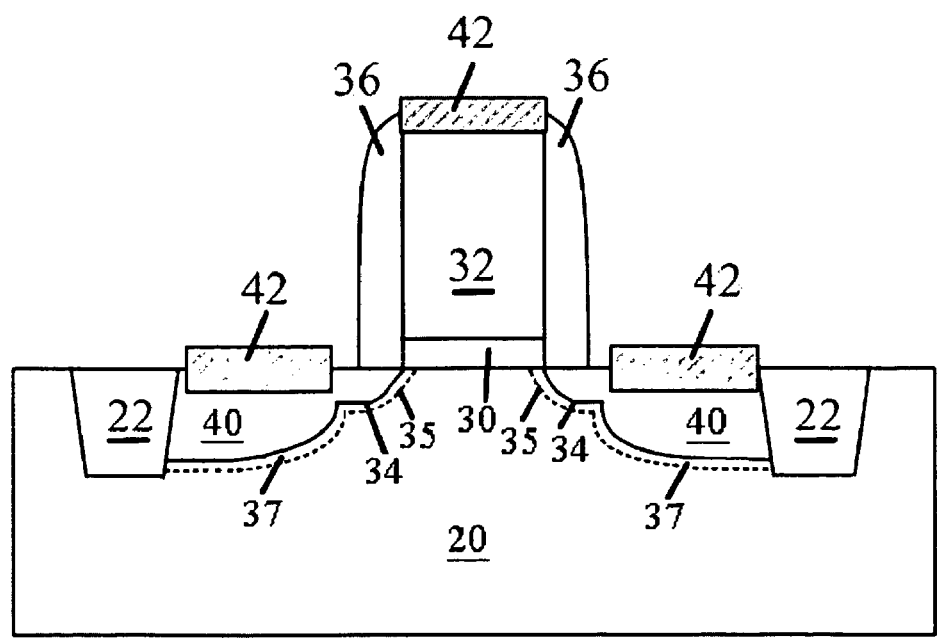

Referring to FIG. 6, silicide regions 42 are formed on source/drain regions 40 and gate electrode 32. Silicide regions 42 may include nickel silicide, cobalt silicide, titanium silicide, or the like. As is known in the art, to form silicide regions, a metal layer is formed by blanket depositing a thin layer of metal, such as cobalt, nickel, titanium, and the like, over the structure shown in FIG. 5. The respective wafer including substrate 20 is then annealed to form a silicide between the metal and the underlying silicon regions. Unreacted metal is then removed, leaving silicide regions only.

Figure 7:
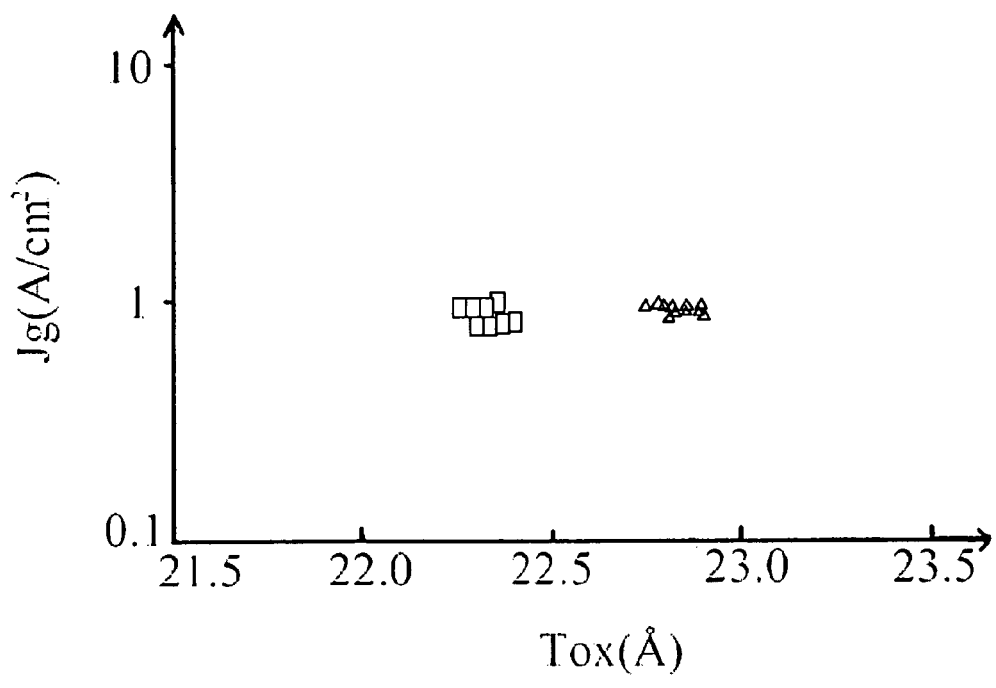
FIG. 7 illustrates leakage current density as a function of gate dielectric thickness, wherein results from samples formed using different methods are compared.

Experiments have revealed that due to the co-implantation of carbon and nitrogen, the performance and reliability of the resulting NMOS devices are improved. FIG. 7 illustrates the gate leakage current densities of NMOS devices as a function of the thicknesses of gate dielectrics. Two groups of sample NMOS devices were made, with a first group of samples made with no carbon and nitrogen co-implanted into their gate electrodes, and a second group of samples made with both carbon and nitrogen co-implanted into their gate electrodes. It has been found that the gate leakage current densities of the second group of samples (data shown as squares) are substantially equal to that of the first group of samples (data shown as triangles), even if the thicknesses of gate dielectrics of the second group of samples are smaller than the first group of samples. This result indicates that with controlled diffusion resulting from the co-implant, the thickness of the gate dielectrics can be scaled down without causing the increase in leakage currents.

Figure 8:
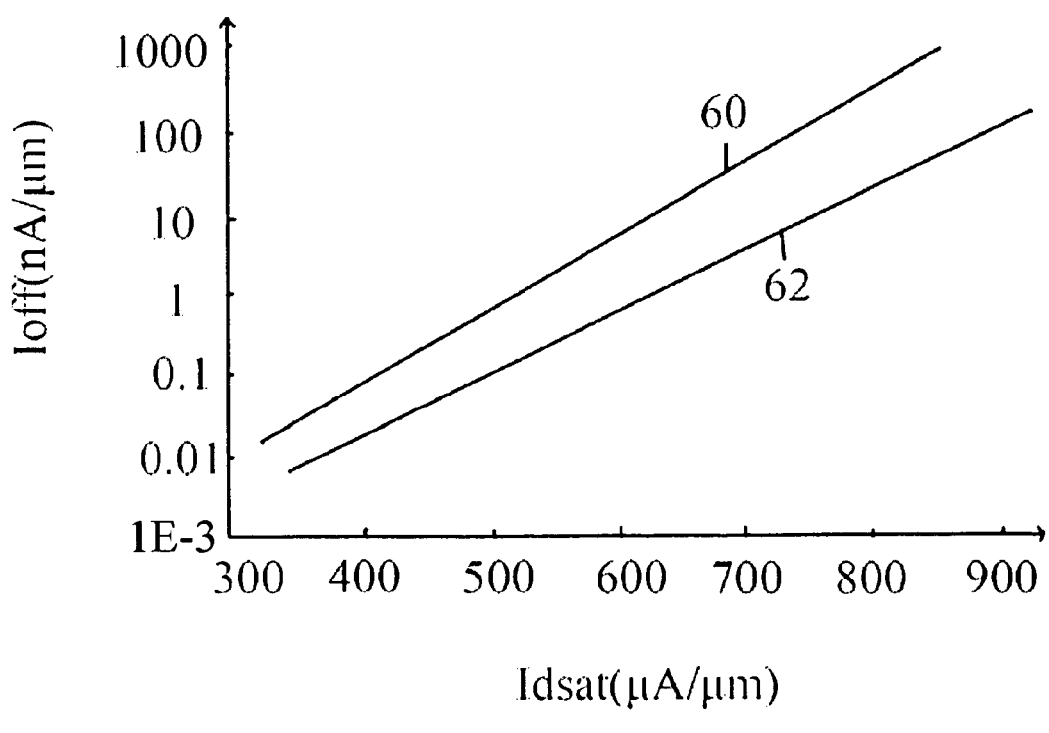
FIG. 8 illustrates leakage current as a function of saturation current, wherein results from samples formed using different methods are compared.

FIG. 8 illustrates leakage currents (Ioff) of sample MOS devices as a function of saturation currents Idsat. Line 60 is the fit line of the data obtained from the first group of samples, while line 62 is the fit line of the data obtained the second group of samples. For clarity, the data from which fit lines 60 and 62 are obtained are not shown. FIG. 8 also proves that the leakage currents of the second group of samples are lower than the first group of samples.

Figure 9:
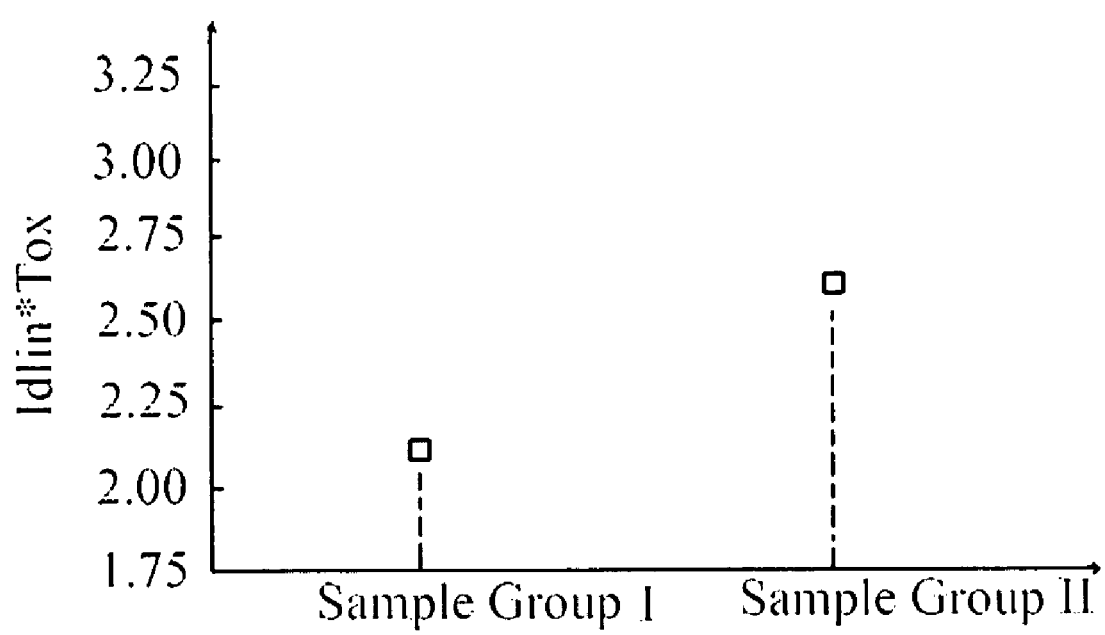
FIG. 9 illustrates index for carrier mobility, wherein results from samples formed using different methods are compared.

FIG. 9 demonstrates the carrier mobility of the first and the second group of samples. The Y-axis, which shows the product of linear current Idlin and gate oxide thickness Tox, may be used as an indicator of the value of carrier mobility. FIG. 9 indicates that the carrier mobility of the first group of samples (sample group I) is lower than the carrier mobility of the second group of samples (sample group II). Therefore, the carbon and nitrogen co-implant also has the advantageous feature of improving carrier mobility in the respective MOS devices.

Besides the above-discussed results, experiment results have also shown that the threshold voltages Vt_lin and Vt_sat of the second group of sample NMOS devices are not affected by the embodiments of the present invention.

The embodiments of the present invention have several advantageous features. By co-implanting carbon and nitrogen into gate electrodes of NMOS devices, the diffusion of n-type impurities in the gate electrodes is reduced. Accordingly, gate electrodes may be implanted using a greater dosage and a higher energy without causing the diffusion of the dopants into, and through, gate dielectrics. Advantageously, the co-implant of carbon and nitrogen also improves the solubility of the dopants, so that more dopant atoms may be activated in the anneals. The improved dosage and activation result in a reduced poly depletion effect. A further advantageous feature is that by co-implanting carbon and nitrogen into the gate electrode layer before its patterning, the energy and the dosage of the co-implanting may be optimized without adversely affecting the source and drain regions.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor structure, the method comprising:
    providing a semiconductor substrate;
    forming a gate dielectric layer over the semiconductor substrate;
    forming a gate electrode layer over the gate dielectric layer;
    doping carbon and nitrogen into the gate electrode layer, wherein the step of doping comprises implanting;
    after the step of doping carbon and nitrogen, patterning the gate dielectric layer and the gate electrode layer to form a gate dielectric and a gate electrode, respectively;
    after the step of patterning, forming a source/drain region; and
    co-implanting carbon and nitrogen into the source/drain region, wherein a lower energy is used in the step of co-implanting carbon and nitrogen into the source/drain region than in the step of doping carbon and nitrogen into the gate electrode layer.

2. The method of claim 1 further comprising, before the step of patterning, implanting an n-type impurity into the gate electrode layer.

3. The method of claim 2 further comprising, before the step of patterning and after the step of doping carbon and nitrogen and the step of implanting the n-type impurity, performing an annealing.

4. The method of claim 1 further comprising:
    after the step of patterning, forming a lightly doped source/drain region; and
    co-implanting carbon and nitrogen into the lightly doped source/drain region.

5. The method of claim 1 further comprising, after the step of co-implanting carbon and nitrogen into the source/drain region, performing a spike annealing and a millisecond annealing.

6. The method of claim 1 further comprising:
after the step of patterning, forming a source/drain region; and
performing an annealing to activate the source/drain region; wherein between the step of patterning and the step of performing the annealing, no carbon or nitrogen is implanted into the source/drain region.

7. The method of claim 1, wherein the step of doping carbon and nitrogen is performed simultaneously with the step of forming the gate electrode layer.

8. The method of claim 7, wherein carbon is doped into a first region of the gate electrode layer, nitrogen is doped into a second region of the gate electrode layer, and wherein the first region is deeper than the second region.

9. The method of claim 8, wherein at least one of the first region and the second region is a sheet region having a top surface lower than a top surface of the gate electrode layer.

10. A method for forming a semiconductor structure, the method comprising:
providing a semiconductor substrate;
forming a gate dielectric layer over the semiconductor substrate;
forming a gate electrode layer over the gate dielectric layer;
implanting carbon into the gate electrode layer;
implanting nitrogen into the gate electrode layer, wherein carbon is implanted deeper than nitrogen is implanted;
implanting an n-type impurity into the gate electrode layer;
performing a first annealing to the gate electrode layer;
patterning the gate dielectric layer and the gate electrode layer to form a gate stack;
forming a source/drain region; and
performing a second annealing to the source/drain region.

11. The method of claim 10, wherein between the step of patterning and the step of performing the second annealing, no element selected from the group consisting essentially of carbon and nitrogen is doped into the source/drain region.

12. The method of claim 10 further comprising, between the step of patterning and the step of performing the second annealing:
implanting carbon into the source/drain region; and
implanting nitrogen into the source/drain region.

13. The method of claim 12, wherein the step of implanting carbon into the gate electrode layer is performed using a first energy greater than a second energy for implanting carbon into the source/drain region.

14. The method of claim 12, wherein the step of implanting nitrogen into the gate electrode layer is performed using a first energy greater than a second energy for implanting nitrogen into the source/drain region.

15. The method of claim 10, wherein the first annealing comprises laser annealing.

16. The method of claim 10, wherein the second annealing comprises spike annealing and millisecond annealing.

17. The method of claim 10, wherein during the steps of implanting carbon, nitrogen, and the n-type impurity, a PMOS region on the semiconductor substrate is masked.

* * * * *